United States Patent  (10) Patent No.: US 11,631,744 B2
Jin  (45) Date of Patent: Apr. 18, 2023

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 110 days.

(21) Appl. No.: 17/313,214

(22) Filed: May 6, 2021

(65) Prior Publication Data

US 2022/0199791 A1 Jun. 23, 2022

(30) Foreign Application Priority Data

Dec. 21, 2020 (CN) .......................... 202011522393.4

(51) Int. Cl.
*H01L 29/417* (2006.01)
*H01L 27/11* (2006.01)
(Continued)

(52) U.S. Cl.
CPC .. *H01L 29/41791* (2013.01); *H01L 21/28518* (2013.01); *H01L 21/823814* (2013.01);
(Continued)

(58) Field of Classification Search
CPC ......... H01L 29/41791; H01L 21/28518; H01L 21/823814; H01L 21/823821;
(Continued)

(56) References Cited

U.S. PATENT DOCUMENTS

2019/0355729 A1* 11/2019 Liaw ................... H01L 27/0207

* cited by examiner

*Primary Examiner* — Karen Kusumakar
*Assistant Examiner* — Adam S Bowen
(74) *Attorney, Agent, or Firm* — Crowell & Moring, L.L.P.

(57) ABSTRACT

Disclosed are a semiconductor structure and a forming method thereof. In one form, a forming method includes: providing a base, including a substrate and a plurality of fins protruding from the substrate, an interlayer dielectric layer formed on the substrate, a gate opening formed in the interlayer dielectric layer, the gate opening spanning the fin and exposing a part of a top and a part of a sidewall of the fin, and a source/drain doped region formed in the fins on two sides of the gate opening, where the substrate includes a first region and a second region adjacent to each other, to respectively form transistors, the gate opening located in either of the first region and the second region extends to the other region and exposes the fin of the other region, and a position of the exposed fin of the other region is used as an interconnect position; forming a gate dielectric layer covering a bottom and a sidewall of the gate opening and the fin in the gate opening conformally; removing the gate dielectric layer on a surface of the fin at the interconnect position, to expose the surface of the fin at the interconnect position; and forming a gate structure in the gate opening after the surface of the fin at the interconnect position is exposed. The present disclosure enlarges a process window for electrical connection.

16 Claims, 10 Drawing Sheets

(51) Int. Cl.
    *H01L 27/092*     (2006.01)
    *H01L 29/08*      (2006.01)
    *H01L 29/45*      (2006.01)
    *H01L 29/66*      (2006.01)
    *H01L 21/285*     (2006.01)
    *H01L 21/8238*    (2006.01)
    *H01L 29/78*      (2006.01)

(52) U.S. Cl.
    CPC ......... *H01L 21/823821* (2013.01); *H01L 21/823871* (2013.01); *H01L 27/0924* (2013.01); *H01L 27/1104* (2013.01); *H01L 29/0847* (2013.01); *H01L 29/45* (2013.01); *H01L 29/66545* (2013.01); *H01L 29/66795* (2013.01); *H01L 29/7851* (2013.01)

(58) Field of Classification Search
    CPC ......... H01L 21/823871; H01L 27/0924; H01L 27/1104; H01L 29/0847; H01L 29/45; H01L 29/66545; H01L 29/66795; H01L 29/7851; H01L 21/823431; H01L 27/0886; H01L 29/6681; H01L 29/7854; H01L 29/456; H01L 21/823828; H01L 21/823857
    See application file for complete search history.

SEMICONDUCTOR STRUCTURE AND FORMING METHOD THEREOF

RELATED APPLICATIONS

The present application claims priority to Chinese Patent Appln. No. 202011522393.4, filed Dec. 21, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

With the rapid growth of the semiconductor integrated circuit (IC) industry, semiconductor technologies are continuously developed toward smaller process nodes driven by Moore's Law, and ICs are accordingly developed toward a direction of smaller size, higher circuit precision, and higher circuit complexity. Meanwhile, the development of three-dimensional designs, such as a fin field effect transistor (FinFET), is facilitated.

Regardless of whether it is a planar device or a device with a three-dimensional design, the current is usually conducted through a metal connection structure, to implement a specific function of the semiconductor device. Generally, different semiconductor devices are electrically connected using a metal contact. The metal contact may be connected to a gate structure or may be connected to a source/drain region.

SUMMARY

To address the foregoing problem, embodiments and implementations of the present disclosure provide a forming method of a semiconductor structure, to enlarge a process window for electrical connection.

To address the foregoing problem, the present disclosure provide forms of a semiconductor structure. In one form, a semiconductor structure includes: a base, including a substrate and a plurality of fins protruding from the substrate, where the substrate includes, along an arrangement direction of the plurality of fins, a first region and a second region adjacent to each other, and the first region and the second region are respectively used for forming transistors; a gate structure, spanning the fins of the plurality of fins and covering a part of a top and a part of a sidewall of the fins of the plurality of fins, where the gate structure located in either of the first region or the second region extends to the other region and covers the fin of the other region, a position of the covered fin of the other region configured for use as an interconnect position, and where the gate structure and the fin are directly electrically connected at the interconnect position; a source/drain doped region, located in the fins of the plurality of fins on two sides of the gate structure; a gate dielectric layer, located between the gate structure and the base, the gate dielectric layer exposing a surface of the fin at the interconnect position; and an interlayer dielectric layer, located on the substrate on a side of the gate structure and covering a sidewall of the gate structure.

The present disclosure further provides forms of a forming method of a semiconductor structure. In one form, a forming method of a semiconductor structure includes: providing a base, including a substrate and a plurality of fins protruding from the substrate, an interlayer dielectric layer formed on the substrate, a gate opening formed in the interlayer dielectric layer, the gate opening spanning the fins of the plurality of fins and exposing a part of a top and a part of a sidewall of the fins of the plurality of fins, and a source/drain doped region formed in the fins of the plurality of fins on two sides of the gate opening, where the substrate includes, along an arrangement direction of the plurality of fins, a first region and a second region adjacent to each other, the first region and the second region are respectively used for forming transistors, a gate opening located in either of the first region and the second region extends to the other region and exposes the fin of the other region, and a position of the exposed fin of the other region is used as an interconnect position; forming a gate dielectric layer covering a bottom and a sidewall of the gate opening and the fin in the gate opening conformally; removing the gate dielectric layer on a surface of the fin at the interconnect position, to expose the surface of the fin at the interconnect position; and forming a gate structure in the gate opening after the surface of the fin at the interconnect position is exposed.

Compared with existing technologies, technical solutions of embodiments and implementations of the present disclosure have at least the following advantages.

In a semiconductor structure provided in embodiments and implementations of the present disclosure, the fins on the two sides of the gate structure are provided with the source/drain doped region, the substrate includes, along the arrangement direction of the plurality of fins, the first region and the second region adjacent to each other, and the first region and the second region are respectively used for forming transistors. The gate structure located in either of the first region or the second region extends to the other region and covers the fin of the other region, the position of the covered fin of the other region is used as the interconnect position, and the gate dielectric layer exposes the surface of the fin at the interconnect position, so that the gate structure and the fin are directly electrically connected at the interconnect position, and the gate structure and the source/drain doped region in the fin corresponding to the interconnect position are directly electrically connected, to meet actual wiring requirements. Compared with the solution in which the gate structure and the source/drain doped region in the fin corresponding to the interconnect position are electrically connected using a contact, embodiments and implementations of the present disclosure enlarge a process window for electrically connecting the gate structure and the source/drain doped region in the fin corresponding to the interconnect position. Correspondingly, it is also beneficial to saving masks.

In some implementations, the semiconductor structure is a SRAM device, and the first region and the second region are respectively used for forming a first pull-up transistor and a second pull-up transistor. In some implementations, no share contact is needed to electrically connect the gate structure and the source/drain doped region in the fin corresponding to the interconnect position. The gate dielectric layer exposes the surface of the fin at the interconnect position, so that the fin at the interconnect position and the gate structure are directly electrically connected, to realize the normal operation of the SRAM device, which correspondingly enlarges the process window of the electrical connection process, and can save masks, thereby correspondingly reducing process costs.

In forms of the forming method of a semiconductor structure provided in the present disclosure, the source/drain doped region is formed in the fins on the two sides of the gate opening, the substrate includes, along the arrangement direction of the plurality of fins, the first region and the second region adjacent to each other, and the first region and the second region are respectively used for forming transistors. The gate opening located in either of the first region and the second region extends to the other region and exposes the fin of the other region, and the position of the exposed fin of the other region is used as an interconnect position. The gate dielectric layer covering the bottom and the sidewall of the gate opening and the fin in the gate opening is conformally formed. The gate dielectric layer on the surface of the fin at the interconnect position is removed, to expose the surface of the fin at the interconnect position. The gate structure in the gate opening is formed after the surface of the fin at the interconnect position is exposed. In embodiments and implementations of the present disclosure, after the gate dielectric layer on the surface of the fin at the interconnect position is removed and the surface of the fin at the interconnect position is exposed, the gate structure is formed in the gate opening. Therefore, the fin at the interconnect position and the gate structure are directly electrically connected, so that the gate structure and the source/drain doped region in the fin corresponding to the interconnect position are directly electrically connected, to meet actual wiring requirements. Compared with the solution in which the gate structure and the source/drain doped region in the fin corresponding to the interconnect position are electrically connected using a contact, embodiments and implementations of the present disclosure enlarge a process window for electrically connecting the gate structure and the source/drain doped region in the fin corresponding to the interconnect position. Correspondingly, it is also beneficial to saving masks.

In some implementations, the semiconductor structure is a SRAM device, and the first region and the second region are respectively used for forming a first pull-up transistor and a second pull-up transistor. In embodiments and implementations of the present disclosure, no share contact is needed to electrically connect the gate structure and the source/drain doped region in the fin corresponding to the interconnect position. The gate dielectric layer on the surface of the fin at the interconnect position is removed, to expose the surface of the fin at the interconnect position, so that the fin at the interconnect position and the gate structure are directly electrically connected, to realize the normal operation of the SRAM device, which correspondingly enlarges the process window of the electrical connection process, and can save masks, thereby correspondingly reducing process costs.

DETAILED DESCRIPTION

At present, a process window for an electrical connection of a semiconductor structure still needs to be enlarged. Reasons why the process window for electrical connection still needs to be enlarged are analyzed now with reference to a forming method of a semiconductor structure.

Figure 1:
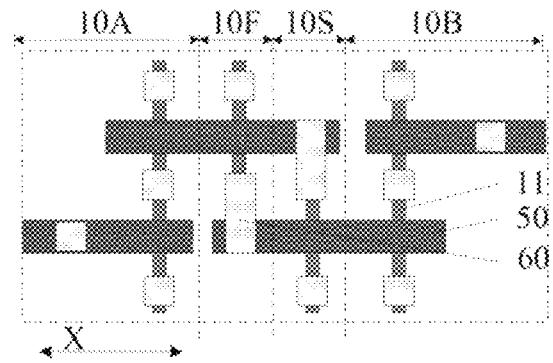
FIG. 1 is a top view corresponding to a forming method of a semiconductor structure.

FIG. 1 is a top view corresponding to a forming method of a semiconductor structure.

Referring to FIG. 1, a base (not shown) is provided, including a substrate (not shown) and a plurality of fins 11 protruding from the substrate. An interlayer dielectric layer (not shown) is formed on the substrate, a gate opening (not shown) is formed in the interlayer dielectric layer, the gate opening spans the fin 11 and exposes a part of a top and a part of a sidewall of the fin 11, and a source/drain doped region (not shown) is formed in the fins 11 on two sides of the gate opening. The substrate includes, along an arrangement direction (shown by a direction X in FIG. 1) of the plurality of fins 11, a first region 10F and a second region 10S adjacent to each other, and the first region 10F and the second region 10S are respectively used for forming transistors. The gate opening located in either of the first region 10F and the second region 10S extends to the other region and exposes the fin 11 of the other region, and a position of the fin 11 exposed by a gate opening of the other region is used as an interconnect position (not marked). A gate structure 50 is formed in the gate opening. A share contact 60 is formed on a top of the gate structure 50 at the interconnect position. The share contact 60 is further connected to the source/drain doped region in the fin 11 at the interconnect position.

Specifically, for example, the semiconductor structure is a SRAM device. The SRAM device includes a plurality of SRAM units (shown by dashed boxes in FIG. 1). In the SRAM units, the first region 10F is used for forming a first pull-up transistor, and the second region 10S is used for forming a second pull-up transistor.

Along the arrangement direction of the plurality of fins 11, the substrate further includes: a third region 10A, located on a side of the first region 10F away from the second region 10S, the third region 10A being used for forming a first pull-down transistor; and a fourth region 10B, located on a side of the second region 10S away from the first region 10F, the fourth region 10B being used for forming a second pull-down transistor.

In the SRAM units, the first pull-up transistor and the first pull-down transistor constitute a first inverter, and the second pull-up transistor constitutes a second inverter. An input end of the first inverter and an output end of the second inverter are connected to form a latch, and an input end of the second inverter and an output end of the first inverter are connected to form a latch. That is, the gate structure 50 of the first pull-up transistor and the source/drain doped region of the second pull-up transistor are electrically connected through the share contact 60, and the gate structure 50 of the second pull-up transistor and the source/drain doped region of the first pull-up transistor are electrically connected through the share contact 60.

However, as the semiconductor structure continues to shrink, a spacing between the first pull-up transistor and the second pull-up transistor becomes smaller, resulting in a smaller process window for forming the share contact 60. Meanwhile, when a spacing between two adjacent share contacts 60 is relatively small, the two adjacent share contacts 60 need to be formed separately using different masks. As a result, a mask needs to be added to form the share contacts 60, thereby increasing process costs.

To address the technical problem described above, the present disclosure provides forms of a forming method of a semiconductor structure, In one form, the a forming method of a semiconductor structure includes: providing a base, including a substrate and a plurality of fins protruding from the substrate, an interlayer dielectric layer being formed on the substrate, a gate opening being formed in the interlayer dielectric layer, the gate opening spanning the fins and exposing a part of a top and a part of a sidewall of the fins, and a source/drain doped region being formed in the fins on two sides of the gate opening, where the substrate includes, along an arrangement direction of the plurality of fins, a first region and a second region adjacent to each other, the first region and the second region configured for use in forming transistors, the gate opening located in either of the first region or the second region extends to the other region and exposes the fin of the other region, and a position of the exposed fin of the other region is used as an interconnect position; forming a gate dielectric layer covering a bottom and a sidewall of the gate opening and the fin in the gate opening conformally; removing the gate dielectric layer on a surface of the fin at the interconnect position, to expose the surface of the fin at the interconnect position; and forming a gate structure in the gate opening after the surface of the fin at the interconnect position is exposed.

In forms of the forming method provided in the present disclosure, the source/drain doped region is formed in the fins on the two sides of the gate opening, the substrate includes, along the arrangement direction of the plurality of fins, the first region and the second region adjacent to each other, and the first region and the second region are respectively used for forming transistors. The gate opening located in either of the first region or the second region extends to the other region and exposes the fin of the other region, and the position of the exposed fin of the other region is used as an interconnect position. The gate dielectric layer covering the bottom and the sidewall of the gate opening and the fin in the gate opening conformally is formed. The gate dielectric layer on the surface of the fin at the interconnect position is removed, to expose the surface of the fin at the interconnect position. The gate structure in the gate opening is formed after the surface of the fin at the interconnect position is exposed. In forms of the present disclosure, after the gate dielectric layer on the surface of the fin at the interconnect position is removed and the surface of the fin at the interconnect position is exposed, the gate structure is formed in the gate opening. Therefore, the fin at the interconnect position and the gate structure are directly electrically connected, so that the gate structure and the source/drain doped region in the fin corresponding to the interconnect position are directly electrically connected, to meet actual wiring requirements. Compared with the solution in which the gate structure and the source/drain doped region in the fin corresponding to the interconnect position are electrically connected using a contact, embodiments and implementations of the present disclosure enlarge a process window for electrically connecting the gate structure and the source/drain doped region in the fin corresponding to the interconnect position. Correspondingly, it is also beneficial to saving masks.

To make the foregoing objectives, features, and advantages of embodiments and implementations of the present disclosure more apparent and easier to understand, specific embodiments and implementations of the present disclosure are described in detail below with reference to the accompanying drawings.

Figure 2:
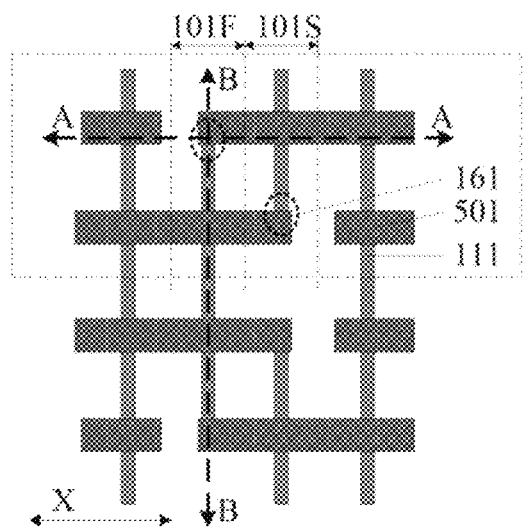
FIG. 2 to FIG. 4 are schematic structural diagrams of one form of a semiconductor structure according to the present disclosure.
Figure 3:
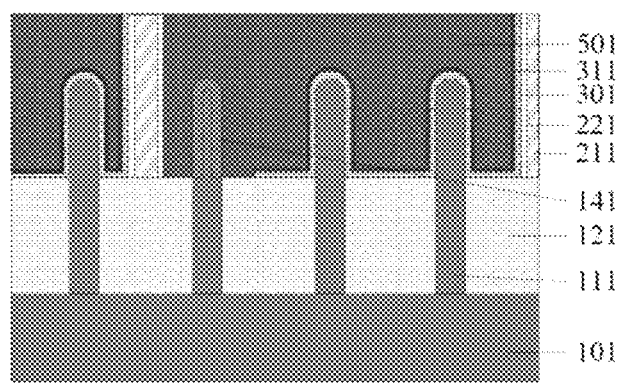
Figure 4:
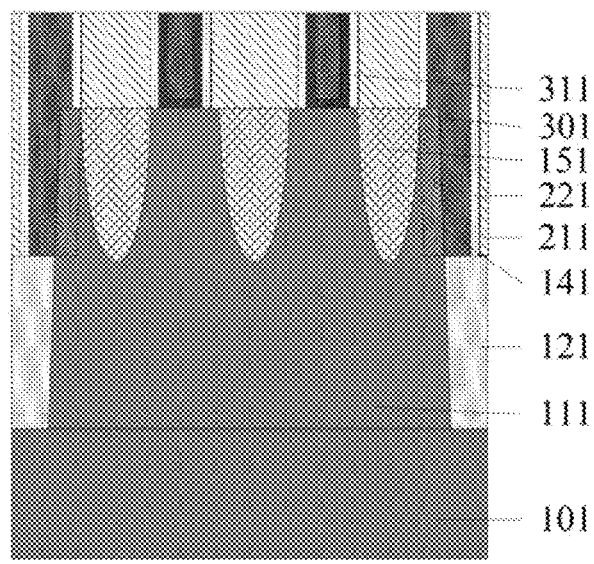

FIG. 2 to FIG. 4 are schematic structural diagrams of one form of a semiconductor structure according to the present disclosure. FIG. 2 is a top view of fins and a gate structure. FIG. 3 is a cross-sectional view in a direction of AA in FIG. 2. FIG. 4 is a cross-sectional view in a direction of BB in FIG. 2. For ease of illustration, FIG. 2 illustrates only the fins and the gate structure.

The semiconductor structure includes: a base (not marked), including a substrate 101 and a plurality of fins 111 protruding from the substrate 101, where the substrate 101 includes, along an arrangement direction (shown by a direction X in FIG. 2) of the plurality of fins 111, a first region 101F and a second region 101S adjacent to each other, and the first region 101F and the second region 101S are respectively used for forming transistors; a gate structure 501, spanning the fin 111 and covering a part of a top and a part of a sidewall of the fin 111, where the gate structure 501 located in either of the first region 101F and the second region 101S extends to the other region and cover the fin 111 of the other region, a position of the covered fin 111 of the other region is used as an interconnect position 161, and the gate structure 501 and the fin 111 are directly electrically connected at the interconnect position 161; a source/drain doped region 151, located in the fins 111 on two sides of the gate structure 501; a gate dielectric layer 301, located between the gate structure 501 and the base, the gate dielectric layer 301 exposing a surface of the fin 111 at the interconnect position 161; and an interlayer dielectric layer 211, located on the substrate 101 on a side of the gate structure 501 and covering a sidewall of the gate structure 501.

In the semiconductor structure provided in this form of the present disclosure, the fins 111 on the two sides of the gate structure 501 are provided with the source/drain doped region 151, the substrate 101 includes, along the arrangement direction of the plurality of fins 111, the first region 101F and the second region 101S adjacent to each other, and the first region 101F and the second region 101S are respectively used for forming transistors. The gate structure 501 located in either of the first region 101F and the second region 101S extends to the other region and cover the fin 111 of the other region, the position of the covered fin 111 of the other region is used as the interconnect position 161, and the gate dielectric layer 301 exposes the surface of the fin 111 at the interconnect position 161, so that the gate structure 501 and the fin 111 are directly electrically connected at the interconnect position 161, and the gate structure 501 and the source/drain doped region 151 in the fin 111 corresponding to the interconnect position 161 are directly electrically connected, to meet actual wiring requirements. Compared with the solution in which the gate structure and the source/drain doped region in the fin corresponding to the interconnect position are electrically connected using a contact, this form enlarges a process window for electrically connecting the gate structure 501 and the source/drain doped region 151 in the fin 111 corresponding to the interconnect position 161. Correspondingly, it is also beneficial to saving masks.

The base provides a process operation basis for the forming process of the semiconductor structure.

In some implementations, the base includes the substrate 101, and a material of the substrate 101 is silicon. In other implementations, the material of the substrate may alternatively be one or more of germanium, silicon germanium, silicon carbide, gallium arsenide, and indium gallium, and the substrate may alternatively be other types of substrates such as a silicon substrate on an insulator or a germanium substrate on an insulator. The material of the substrate may be a material suitable for process requirements or easy to integrate.

In some implementations, the semiconductor structure is a FinFET. The fin 111 is used for providing a channel for the FinFET.

In some implementations, the fin 111 and the substrate 101 are an integrated structure. In other implementations, the fin may alternatively be a semiconductor layer epitaxially grown on the substrate, to accurately control the height of the fin.

In some implementations, a material of the fin 111 is the same as the material of the substrate 101, and the material of the fin 111 is silicon. In other implementations, the material of the fin may alternatively be one or more of germanium, silicon germanide, silicon carbide, gallium arsenide, and indium gallide, and the material of the fin may alternatively be different from the material of the substrate.

In some implementations, the substrate 101 includes, along the arrangement direction of the plurality of fins 111, the first region 101F and the second region 101S adjacent to each other, and the first region 101F and the second region 101S are respectively used for forming transistors.

In some implementations, the semiconductor structure includes a SRAM device. The SRAM device includes a plurality of SRAM units (shown by dashed boxes in FIG. 2). In an example, FIG. 2 shows two SRAM units, but a quantity of SRAM units included in the SRAM device is not limited to two.

Correspondingly, the first region 101F and the second region 101S are both PMOS regions for forming P-type transistors. Specifically, the first region 101F and the second region 101S are respectively used for forming a first pull-up transistor and a second pull-up transistor.

The interlayer dielectric layer 211 is used for isolating adjacent devices.

A material of the interlayer dielectric layer 211 is an insulation material. The insulation material includes one or more of silicon oxide, silicon nitride, silicon oxynitride, silicon oxycarbide, silicon carbonitride, and silicon oxycarbonitride.

In an example, a gate opening (not shown) is formed in the interlayer dielectric layer 211, and the gate structure 501 is located in the gate opening.

The gate opening is used for providing space for the gate structure 501. In the forming process of the semiconductor structure, a dummy gate structure is first used to occupy a position of the gate structure 501. Therefore, the gate opening is formed in the interlayer dielectric layer 211, that is, the gate opening is formed by removing the dummy gate structure, and a position of the gate opening corresponds to the position of the gate structure 501.

In some implementations, the gate structure 501 located in either of the first region 101F and the second region 101S extends to the other region and exposes the fin 111 of the other region, and the position of the covered fin 111 of the other region is used as the interconnect position 161.

The fin 111 at the interconnect position 161 in either of the first region 101F and the second region 101S is used for directly electrically connecting to the gate structure 501 in the other region.

Specifically, the source/drain doped region 151 is formed in the fins 111 on the two sides of the gate structure 501, that is, the source/drain doped region 151 is formed in the fin 111 corresponding to the interconnect position 161. Therefore, the gate structure 501 in either of the first region 101F and the second region 101S is directly electrically connected to the fin 111 at the interconnect position 161 in the other region, so that the gate structure 501 in either region and the source/drain doped region 151 in the fin 111 corresponding to the interconnect position 161 in the other region are electrically connected.

In some implementations, the semiconductor structure includes a SRAM device, and the first region 101F and the second region 101S are respectively used for forming a first pull-up transistor and a second pull-up transistor. Therefore, the gate structure 501 in the first region 101F extends to the second region 101S and covers the fin 111 in the second region 101S, and in the second region 101S, a position of the fin 111 covered by the gate structure 501 in the first region 101F is used as the interconnect position 161. Similarly, the gate structure 501 in the second region 101S extends to the first region 101F and covers the fin 111 in the first region 101F, and in the first region 101F, a position of the fin 111 covered by the gate structure 501 in the second region 101S is used as the interconnect position 161.

The source/drain doped region 151 is located in the fins 111 on the two sides of the gate structure 501. The source/drain doped region 151 is used as a source region or a drain region of the formed FinFET. Specifically, a doping type of the source/drain doped region 151 is the same as a channel conductivity type of a corresponding transistor.

The gate dielectric layer 301 is used for electrically isolating the fin 111 and the gate structure 501.

In some implementations, a material of the gate dielectric layer 301 is a high-k dielectric material. The high-k dielectric material refers to a dielectric material whose relative dielectric constant is greater than a relative dielectric constant of silicon oxide. Specifically, the material of the gate dielectric layer 301 may be selected from $HfO_2$, $ZrO_2$, HfSiO, HfSiON, HfTaO, HfTiO, HfZrO, $Al_2O_3$, or the like. In an example, the material of the gate dielectric layer 301 is $HfO_2$.

In some implementations, the gate dielectric layer 301 exposes the surface of the fin 111 at the interconnect position 161.

The gate structure 501 located in either of the first region 101F or the second region 101S extends to the other region and covers the fin 111 of the other region, and the position of the covered fin 111 of the other region is used as the interconnect position 161. Therefore, the gate dielectric layer 301 exposes the surface of the fin 111 at the interconnect position 161, so that at the interconnect position 161, the gate structure 501 and the fin 111 are directly electrically connected.

In some implementations, the semiconductor structure includes a SRAM device, and the first region 101F and the second region 101S are respectively used for forming a first pull-up transistor and a second pull-up transistor. Therefore, no share contact is needed to electrically connect the gate structure 501 in either of the first region 101F and the second region 101S and the source/drain doped region 151 in the fin 111 corresponding to the interconnect position 161 of the other region. The gate dielectric layer 301 exposes the surface of the fin 111 at the interconnect position 161, so that the fin 111 at the interconnect position is directly electrically connected to the gate structure 501. Therefore, the source/drain doped region 151 of the first pull-up transistor is directly electrically connected to the gate structure 501 of the second pull-up transistor, and the source/drain doped region 151 of the second pull-up transistor is directly electrically connected to the gate structure 501 of the first pull-up transistor, to realize the normal operation of the SRAM device without a share contact, which enlarges the process window of the electrical connection process, and can save masks, thereby correspondingly reducing process costs.

In some implementations, the semiconductor structure further includes a cap layer 311. The cap layer 311 is located between the gate structure 501 and the gate dielectric layer 301, and exposes the surface of the fin 111 at the interconnect position.

The cap layer 311 is used for protecting the gate dielectric layer 301 and reducing damage to the gate dielectric layer 301 during the process, as well as reducing diffusion of diffusible ions in the gate structure 501 into the gate dielectric layer 301.

The cap layer 311 exposes the surface of the fin 111 at the interconnect position 161, which means that in the forming process of the semiconductor structure, after the cap layer 311 covering the gate dielectric layer 301 is formed, the cap layer 311 and the gate dielectric layer 301 at the interconnect position 161 are sequentially etched to expose the fin 111 at the interconnect position 161, so that in the process of etching the gate dielectric layer 301, the cap layer 311 can protect the gate dielectric layer 301.

In addition, the cap layer 311 exposes the surface of the fin 111 at the interconnect position 161, so that an effect of the direct electrical connection between the gate structure 501 and the fin 111 at the interconnect position 161 is improved.

In some implementations, the cap layer 311 is a single-layer structure or a laminated structure. A material of the cap layer 311 includes one or two of TaN or TiN.

It should be noted that, in other implementations, the cap layer may alternatively cover the fin at the interconnect position. Because the cap layer is made of a conductive material, even if the cap layer covers the fin at the interconnect position, the direct electrical connection between the gate structure in either region and the fin at the interconnect position in the other region can still be realized.

In some implementations, the semiconductor structure further includes a metal silicide layer 141. The metal silicide layer 141 covers the surface of the fin 111 at the interconnect position; or the material of the fin 111 at the interconnect position 161 is a metal silicide material.

Because the metal silicide layer 141 has a relatively low resistivity, the metal silicide layer 141 is in direct contact with the gate structure 501, to reduce a contact resistance of the interconnect position 161.

Because the metal silicide layer 141 is formed by consuming the material of the fin 111, according to different process requirements (such as a thickness requirement on the metal silicide layer 141) and a width of the fin 111, if a part of the width of the fin 111 at the interconnect position 161 is consumed, the metal silicide layer 141 covers the surface of the fin 111 at the interconnect position; if the fin 111 at the interconnect position 161 is completely consumed, the material of the fin 111 at the interconnect position is a metal silicide material.

In some implementations, a case in which the metal silicide layer 141 covers the surface of the fin 111 at the interconnect position 161 is shown.

In some implementations, the metal silicide layer 141 is in contact with the adjacent source/drain doped region 151 in the fin 111 corresponding to the interconnect position 161.

The semiconductor structure usually further includes a source/drain contact located on a top of the source/drain doped region 151 and electrically connected to the source/drain doped region 151. Because at the interconnect position 161, the gate structure 501 and the fin 111 are directly electrically connected, the gate structure 501 and the source/drain doped region 151 in the fin 111 corresponding to the interconnect position 161 are directly electrically connected. Correspondingly, the gate structure 501 at the interconnect position 161 is electrically connected to the source/drain contact through the source/drain doped region 151 and the metal silicide layer 141. Therefore, the metal silicide layer 141 at the interconnect position 161 is in contact with the adjacent source/drain doped region 151 in the fin 111 corresponding to the interconnect position 161, thereby reducing a resistance between the gate structure 501 at the interconnect position 161 and the source/drain contact, to improve the performance of the semiconductor structure.

A material of the metal silicide layer 141 includes a titanium silicon compound, a cobalt silicon compound, or a nickel silicon compound.

In some implementations, the gate structure 501 includes a metal gate structure for controlling the channel of the FinFET to be turned on or off.

In some implementations, the metal gate structure includes a work function layer (not shown) and a gate electrode layer (not shown) located on the work function layer.

The work function layer is used for adjusting a threshold voltage of the FinFET. When a PMOS transistor is formed, the work function layer is a P-type work function layer, and a material of the P-type work function layer includes at least one of TiN, TaN, TaSiN, TaAlN, or TiAlN. When an NMOS transistor is formed, the work function layer is an N-type work function layer, and a material of the N-type work function layer includes at least one of TiAl, Mo, MoN, AlN, or TiAlC.

The gate electrode layer is used for electrically leading out the metal gate structure. In some implementations, a material of the gate electrode layer is Al, Cu, Ag, Au, Pt, Ni, Ti, or W.

In other implementations, the gate structure may alternatively be a polysilicon gate structure according to process requirements.

In some implementations, the semiconductor structure further includes: a spacer 221, located on the sidewall of the gate structure 501.

The spacer 221 is used for protecting the sidewall of the gate structure 501. The spacer 221 may be a single-layer structure or a laminated structure. A material of the spacer 221 may be at least one of silicon oxide, silicon nitride, silicon carbide, silicon carbonitride, silicon oxy-carbonitride, silicon oxynitride, boron nitride, or boron carbonitride. In some implementations, the spacer 221 is a single-layer structure, and the material of the spacer 221 is silicon nitride.

In some implementations, the semiconductor structure further includes an isolation layer 121. The isolation layer 121 is located on the substrate 101 exposed by the fin 111, and covers a part of the sidewall of the fin 111.

The isolation layer 121 is used for insulation between different devices. For example, in a CMOS manufacturing process, the isolation layer 121 is usually formed between an NMOS transistor and a PMOS transistor.

A material of the isolation layer 121 is an insulation material. In an example, the material of the isolation layer 121 is silicon oxide.

Figure 5:
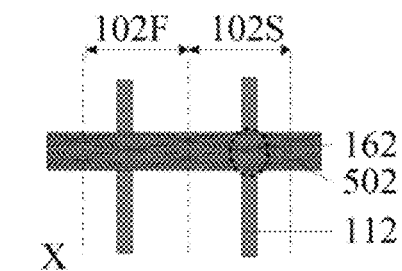
FIG. 5 is a schematic structural diagram of another form of a semiconductor structure according to the present disclosure.

FIG. 5 is a schematic structural diagram of another form of a semiconductor structure according to the present disclosure. For ease of illustration, only a top view of fins and a gate structure is illustrated.

The similarities between this form of the present disclosure and the foregoing form are not repeated herein. The difference between this form of the present disclosure and the foregoing embodiment is that the substrate (not shown) includes, along an arrangement direction (shown by a direction X in FIG. 5) of a plurality of fins 112, a first region 102F and a second region 102S adjacent to each other, a gate opening (not marked) located in either of the first region 102F and second region 102S extends to the other region and exposes the fin 112 of the other region, and a position of the exposed fin 112 of the other region is used as an interconnect position 162. A transistor in the region of the fin 112 at the interconnect position 162 fails, and the fin in the other region is used for forming a transistor.

In some implementations, the gate opening in the first region 102F extends to the second region 102S and exposes the fin 112 in the second region 102S, and in the second region 102S, a position of the fin 112 exposed by the gate opening in the first region 102F is used as the interconnect position 162.

The gate structure 502 in the first region 102F extends to the second region 102S and is directly electrically connected to the fin 112 at the interconnect position 162. Therefore, the first region 102F is used for forming a transistor, and the transistor in the second region 102S fails.

Specifically, the transistor in the second region 102S fails, and the fins 112 on two sides of the gate structure 502 in the second region 102S are also provided with a source/drain doped region. Therefore, the gate structure 502 in the first region 102F is electrically connected to the source/drain doped region (not shown) in the fin 112 corresponding to the interconnect position 162 in the second region 102S. Correspondingly, the gate structure 502 in the first region 102F can be electrically connected to an external circuit through the source/drain doped region in the second region 102S, to meet actual wiring requirements. That is, for the transistor in the first region 102F, a contact for electrically connecting to the gate structure 502 may be disposed in the source/drain doped region in the second region 102S, thereby enlarging the process window for electrical connection.

For detailed descriptions of the semiconductor structure in this form, reference may be made to corresponding descriptions in the foregoing embodiment. Details are not described herein again.

FIG. 6 to FIG. 24 are structural schematic diagrams corresponding to steps in one form of a forming method of a semiconductor structure according to the present disclosure.

Figure 6:
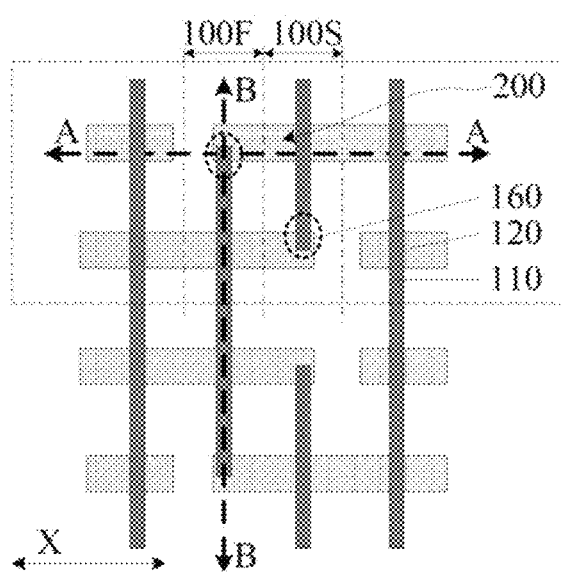
FIG. 6 to FIG. 24 are structural schematic diagrams corresponding to steps in one form of a forming method of a semiconductor structure according to the present disclosure.
Figure 7:
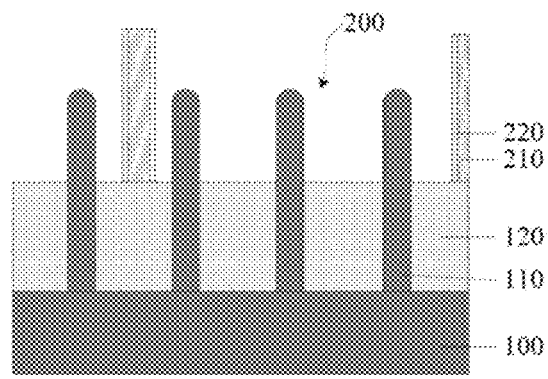
Figure 8:
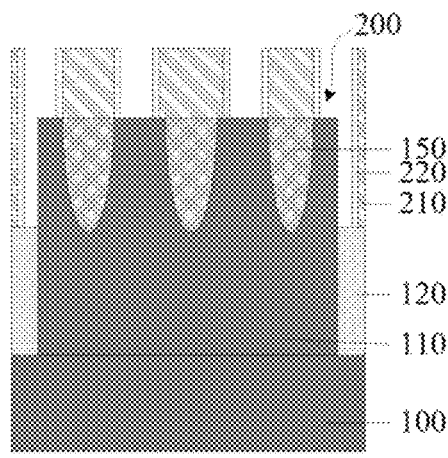

Referring to FIG. 6 to FIG. 8 together, FIG. 6 is a top view of fins and a gate opening, FIG. 7 is a cross-sectional view in a direction of AA in FIG. 6, and FIG. 8 is a cross-sectional view in a direction of BB in FIG. 6. A base (not marked) is provided, including a substrate 100 and a plurality of fins 110 protruding from the substrate 100. An interlayer dielectric layer 210 is formed on the substrate 100. A gate opening 200 is formed in the interlayer dielectric layer 210. The gate opening 200 spans the fin 110 and exposes a part of a top and a part of a sidewall of the fin 110.

A source/drain doped region 150 is formed in the fins 110 on two sides of the gate opening 200. The substrate 100 includes, along an arrangement direction (shown by a direction X in FIG. 6) of the plurality of fins 110, a first region 100F and a second region 100S adjacent to each other, and the first region 100F and the second region 100S are respectively used for forming transistors. The gate opening 200 located in either of the first region 100F and the second region 100S extends to the other region and exposes the fin 110 of the other region, and a position of the exposed fin 110 of the other region is used as an interconnect position 160.

The base provides a process operation basis for the forming process of the semiconductor structure.

In some implementations, the base includes the substrate 100, and a material of the substrate 100 is silicon. In other implementations, the material of the substrate may alternatively be at least one of germanium, silicon germanium, silicon carbide, gallium arsenide, or indium gallium, and the substrate may alternatively be other types of substrates such as a silicon substrate on an insulator or a germanium substrate on an insulator. The material of the substrate may be a material suitable for process requirements or easy to integrate.

In some implementations, the semiconductor structure is a FinFET. The fin 110 is used for providing a channel for the FinFET.

In some implementations, the fin 110 and the substrate 100 are an integrated structure. In other implementations, the fin may alternatively be a semiconductor layer epitaxially grown on the substrate, to accurately control the height of the fin.

In some implementations, a material of the fin 110 is the same as the material of the substrate 100, and the material of the fin 110 is silicon.

In other implementations, the material of the fin may alternatively be at least one of germanium, silicon germanide, silicon carbide, gallium arsenide, or indium gallide, and the material of the fin may alternatively be different from the material of the substrate.

In some implementations, the substrate 100 includes, along the arrangement direction of the plurality of fins 110, the first region 100F and the second region 100S adjacent to each other, and the first region 100F and the second region 100S are respectively used for forming transistors.

In some implementations, the forming method is used for forming a SRAM device. The SRAM device includes a plurality of SRAM units (shown by dashed boxes in FIG. 6). In an example, FIG. 6 shows two SRAM units, but a quantity of SRAM units included in the SRAM device is not limited to two.

Correspondingly, the first region 100F and the second region 100S are both PMOS regions for forming P-type transistors. Specifically, the first region 100F and the second region 100S are respectively used for forming a first pull-up transistor and a second pull-up transistor.

The interlayer dielectric layer 210 is used for isolating adjacent devices.

A material of the interlayer dielectric layer 210 is an insulation material. The insulation material includes at least one of silicon oxide, silicon nitride, silicon oxynitride, silicon oxycarbide, silicon carbonitride, or silicon oxycarbonitride.

The gate opening 200 is used to provide space for forming the gate structure subsequently.

In the forming process of the semiconductor structure, a dummy gate structure is first used to occupy a position of the gate structure. Therefore, the gate opening 200 is formed in the interlayer dielectric layer 210, that is, the gate opening 200 is formed by removing the dummy gate structure.

Therefore, in this form, before the interlayer dielectric layer 210 is formed, the forming method further includes: forming the dummy gate structure (not shown) on the base, the dummy gate structure spanning the fin 110 and covering a part of a top and a part of a sidewall of the fin 110.

The dummy gate structure occupies space for forming the gate structure subsequently.

The dummy gate structure may be a single-layer structure or a laminated structure. A material of the dummy gate structure includes one or two of amorphous silicon and polysilicon. In other implementations, the material of the dummy gate structure may alternatively be silicon oxide, silicon nitride, silicon oxynitride, silicon carbide, silicon carbonitride, silicon oxy-carbonitride, or amorphous carbon.

In some implementations, the interlayer dielectric layer 210 is formed on the base on a side of the dummy gate structure, and the interlayer dielectric layer 210 exposes a top of the dummy gate structure.

The interlayer dielectric layer 210 is further used as a platform basis for forming the gate opening 200.

In some implementations, the step of forming the gate opening 200 including: removing the dummy gate structure.

The dummy gate structure is removed to form the gate opening 200 for forming the gate structure subsequently. In some implementations, the gate opening 200 located in either of the first region 100F and the second region 100S extends to the other region and exposes the fin 110 of the other region, and a position of the exposed fin 110 of the other region is used as an interconnect position 160.

The fin 110 at the interconnect position 160 in either of the first region 100F and the second region 100S are used for directly electrically connecting to the gate structure in the other region.

Specifically, the source/drain doped region 150 is formed in the fins 110 on the two sides of the gate opening 200, that is, the source/drain doped region 150 is formed in the fin 110 corresponding to the interconnect position 160. Therefore, the gate structure in either of the first region 100F and the second region 100S is directly electrically connected to the fin 110 at the interconnect position 160 in the other region, so that the gate structure in either region and the source/drain doped region 150 in the fin 110 corresponding to the interconnect position in the other region are electrically connected.

In some implementations, the forming method is used for forming a SRAM device, and the first region 100F and the second region 100S are respectively used for forming a first pull-up transistor and a second pull-up transistor. Therefore, the gate opening 200 in the first region 100F extends to the second region 100S and exposes the fin 110 in the second region 100S, and in the second region 100S, a position of the fin 110 exposed by the gate opening 200 in the first region 100F is used as the interconnect position 160. Similarly, the gate opening 200 in the second region 100S extends to the first region 100F and exposes the fin 110 in the first region 100F, and in the first region 100F, a position of the fin 110 exposed by the gate opening 200 in the second region 100S is used as the interconnect position 160.

The source/drain doped region 150 is located in the fins 110 on the two sides of the gate opening 200. The source/drain doped region 150 is used as a source region or a drain region of the formed FinFET. Specifically, a doping type of the source/drain doped region 150 is the same as a channel conductivity type of a corresponding transistor.

In some implementations, after the dummy gate structure is formed, and before the interlayer dielectric layer 210 is formed, the forming method further includes: forming a spacer 220 on a sidewall of the dummy gate structure.

The spacer 220 is used for protecting the sidewall of the gate structure. The spacer 220 may be a single-layer structure or a laminated structure, and a material of the spacer 220 includes at least one of silicon oxide, silicon nitride, silicon carbide, silicon carbon nitride, silicon oxycarbonitride, silicon oxynitride, boron nitride, or boron carbon nitride. In some implementations, the spacer 220 is a single-layer structure, and the material of the spacer 220 is silicon nitride.

In some implementations, the base further includes an isolation layer 120.

The isolation layer 120 is used for insulation between different devices. For example, in a CMOS manufacturing process, the isolation layer 120 is usually formed between an NMOS transistor and a PMOS transistor.

A material of the isolation layer 120 is an insulation material. In an example, the material of the isolation layer 120 is silicon oxide.

Figure 9:
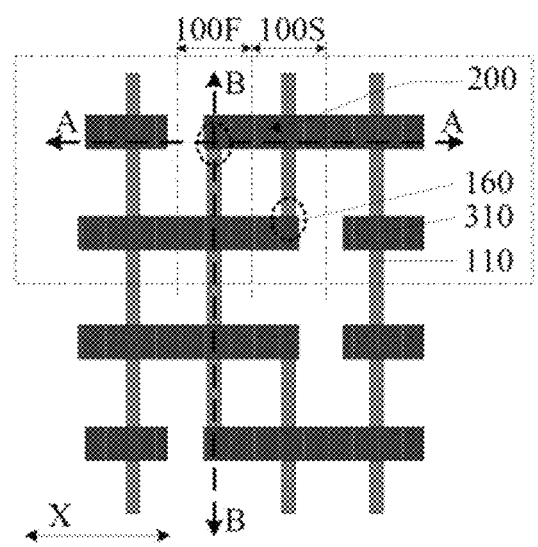
Figure 10:
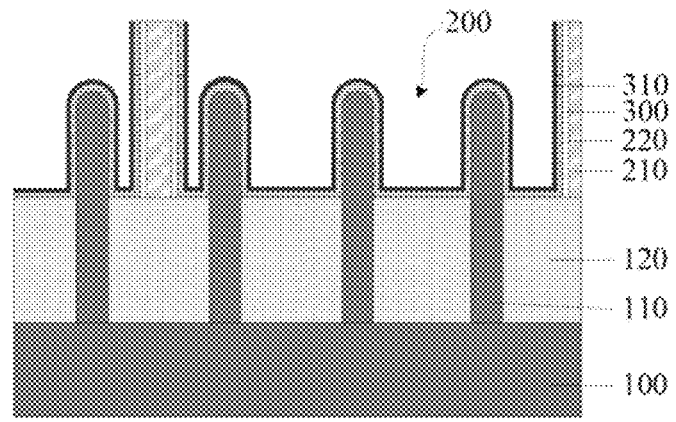
Figure 11:
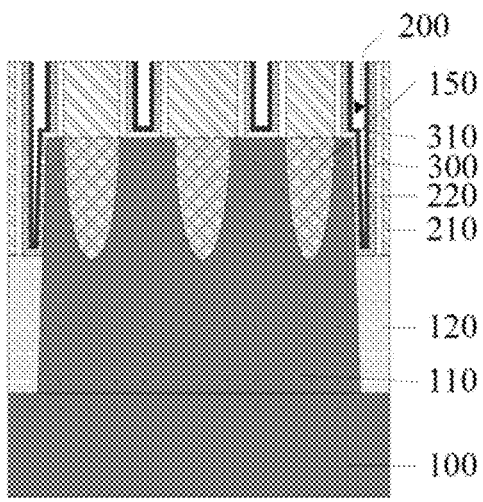

Referring to FIG. 9 to FIG. 11 together, FIG. 9 is a top view based on FIG. 6, FIG. 10 is a cross-sectional view in a direction of AA in FIG. 9, and FIG. 11 is a cross-sectional view in a direction of BB in FIG. 9. A gate dielectric layer 300 covering a bottom and a sidewall of the gate opening 200 and the fin 110 in the gate opening 200 conformally is formed.

The gate dielectric layer 300 is used for electrically isolating the fin 110 and the subsequently formed gate structure.

In some implementations, the gate dielectric layer 300 is formed by using an atomic layer deposition process. The gate dielectric layer 300 formed by using the atomic layer deposition process has good thickness uniformity and a good step coverage capability, so that the gate dielectric layer 300 can cover the bottom and the sidewall of the gate opening 200 and the fin 110 in the gate opening 200 conformally.

In other implementations, the gate dielectric layer may alternatively be formed by using a chemical vapor deposition process.

In some implementations, a material of the gate dielectric layer 300 is a high-k dielectric material. The high-k dielectric material refers to a dielectric material whose relative dielectric constant is greater than a relative dielectric constant of silicon oxide. Specifically, the material of the gate dielectric layer 300 may be selected from $HfO_2$, $ZrO_2$, HfSiO, HfSiON, HfTaO, HfTiO, HfZrO, $Al_2O_3$, or the like. In an example, the material of the gate dielectric layer 300 is $HfO_2$.

It should be noted that the gate dielectric layer 300 on the surface of the fin 110 at the interconnect position 160 needs to be removed subsequently.

In some implementations, after the gate dielectric layer 300 is formed on the bottom and the sidewall of the gate opening 200, and before the gate dielectric layer 300 on the surface of the fin 110 at the interconnect position 160 is removed, the forming method further includes: forming a cap layer 310, the cap layer 310 covering the gate dielectric layer 300 conformally.

The cap layer 310 is used for protecting the gate dielectric layer 300 and reducing damage to the gate dielectric layer 300 during the process, as well as reducing diffusion of diffusible ions in the gate structure into the gate dielectric layer 300 after the gate structure is formed subsequently.

In some implementations, the cap layer 310 is formed by using the atomic layer deposition process.

The cap layer 310 formed by using the atomic layer deposition process has good thickness uniformity and a good step coverage capability, so that the cap layer 310 can cover the gate dielectric layer 300 conformally.

In some implementations, the cap layer 310 is a single-layer structure or a laminated structure. A material of the cap layer 310 includes one or two of TaN or TiN.

Referring to FIG. 12 to FIG. 18 together, the gate dielectric layer 300 on the surface of the fin 110 at the interconnect position 160 is removed, to expose the surface of the fin 110 at the interconnect position 160.

In some implementations, after the gate dielectric layer 300 on the surface of the fin 110 at the interconnect position 160 is removed and the surface of the fin 110 at the interconnect position 160 is exposed, the gate structure is subsequently formed in the gate opening 200. Therefore, the fin 110 at the interconnect position 160 and the gate structure are directly electrically connected, so that the gate structure and the source/drain doped region 150 in the fin 110 corresponding to the interconnect position 160 are directly electrically connected, to meet actual wiring requirements. Compared with the solution in which the gate structure and the source/drain doped region in the fin corresponding to the interconnect position are electrically connected by using a contact, this form of the present disclosure enlarges a process window for electrically connecting the gate structure and the source/drain doped region 150 in the fin 110 corresponding to the interconnect position 160.

In some implementations, the gate dielectric layer 300 on the surface of the fin 110 at the interconnect position 160 is removed using a dry etching process, to expose the surface of the fin 110 at the interconnect position.

The dry etching process has a characteristic of anisotropic etching with a vertical etching rate much higher than a horizontal etching rate. Therefore, using the dry etching process is beneficial to improving the accuracy of pattern transfer, and reducing damage to the gate dielectric layer 300 on the surface of the fin 110 at remaining positions when the gate dielectric layer 300 on the surface of the fin 110 at the interconnect position 160 is removed.

Figure 12:
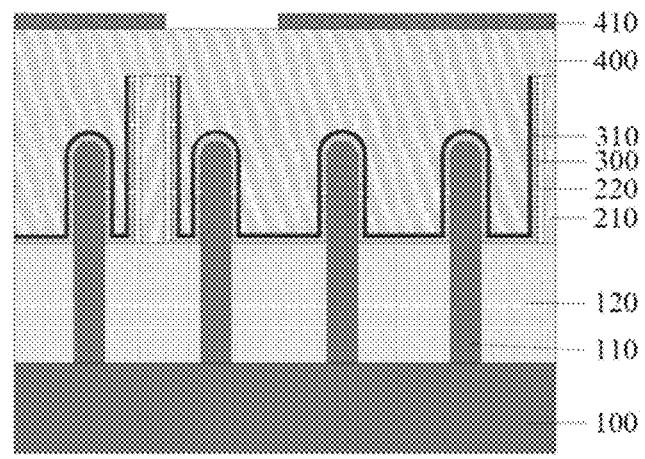
Figure 13:
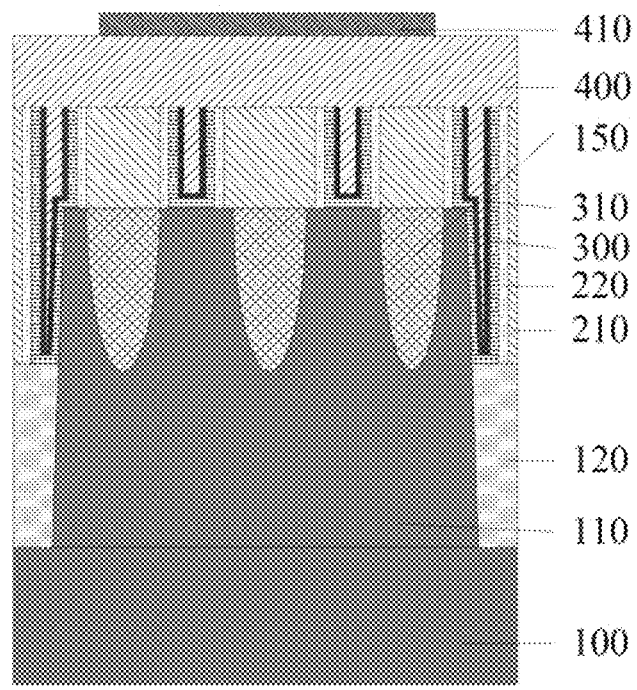

Referring to FIG. 12 and FIG. 13 together, FIG. 12 is a cross-sectional view based on FIG. 10, and FIG. 13 is a cross-sectional view based on FIG. 11. After the gate dielectric layer 300 is formed on the bottom and the sidewall of the gate opening 200, and before the gate dielectric layer 300 on the surface of the fin 110 at the interconnect position 160 is removed, the forming method further includes: forming a planarization layer 400 in the gate opening 200.

The planarization layer 400 is formed for pattern transfer, and is used as an etching mask when the gate dielectric layer 300 is etched.

In some implementations, a material of the planarization layer 400 is a spin-on carbon (SOC) material. The SOC is formed by using a spin-on process with relatively low process costs. Moreover, using the SOC is beneficial to improving the flatness of a top surface of the planarization layer 400, thereby providing a good interface for forming a mask opening.

In some implementations, the forming method further includes: forming a patterned photoresist layer 410 on the planarization layer 400.

The patterned photoresist layer 410 is used for transferring a pattern to the planarization layer 400.

Figure 14:
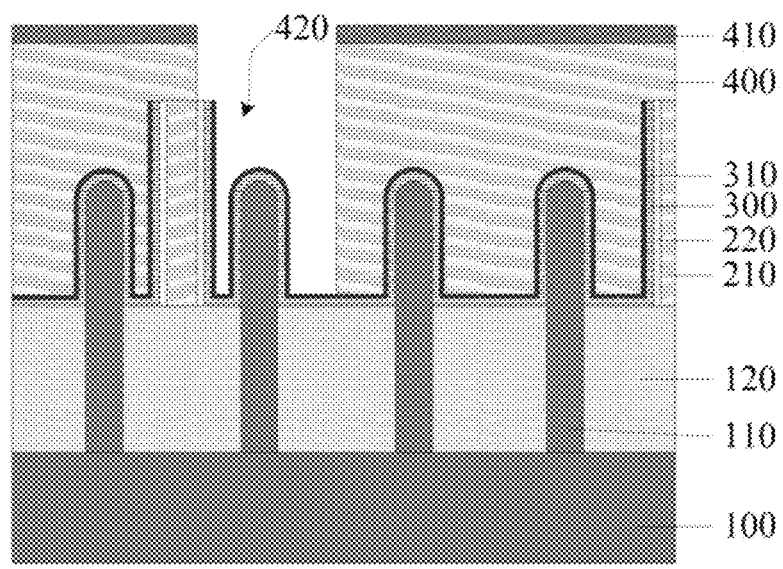
Figure 15:
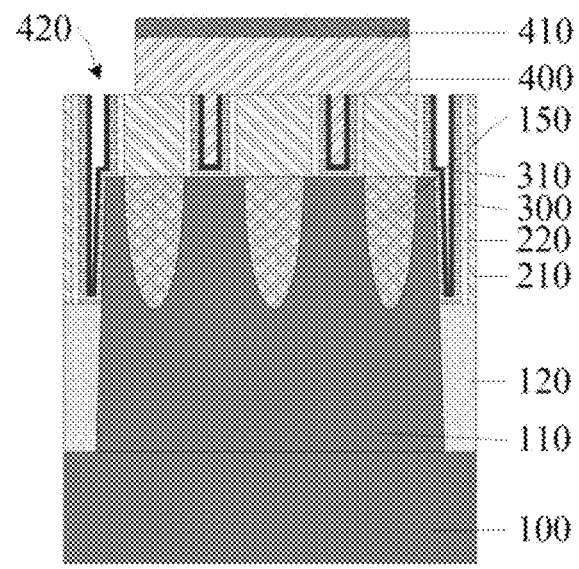

Referring to FIG. 14 and FIG. 15 together, FIG. 14 is a cross-sectional view based on FIG. 12, and FIG. 15 is a cross-sectional view based on FIG. 13. The planarization layer 400 is patterned, and an opening 420 is formed in the planarization layer 400 at the interconnect position 160.

The opening 420 is formed in the planarization layer 400 at the interconnect position 160, to expose the gate dielectric layer 300 at the interconnect position 160, so as to remove the gate dielectric layer 300 on the surface of the fin 110 at the interconnect position 160.

It should be noted that, to facilitate the removal of the gate dielectric layer 300 on the surface of the fin 110 at the interconnect position 160 and enlarge the process window, the opening 420 further exposes a part of the gate dielectric layer 300 on the top of the isolation layer 120 on two sides of the fin 110 at the interconnect position 160.

Figure 16:
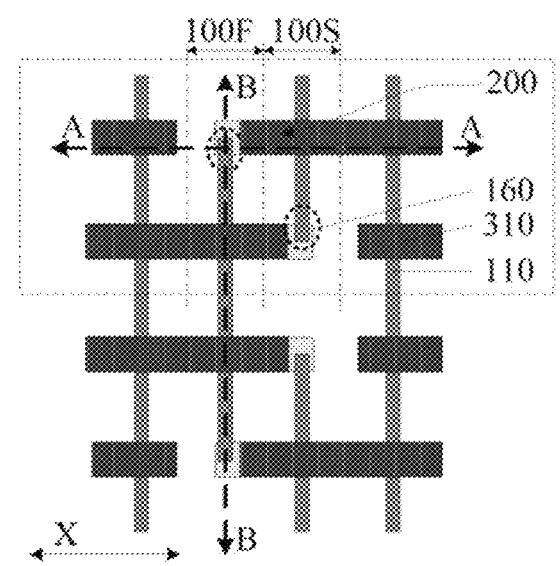
Figure 17:
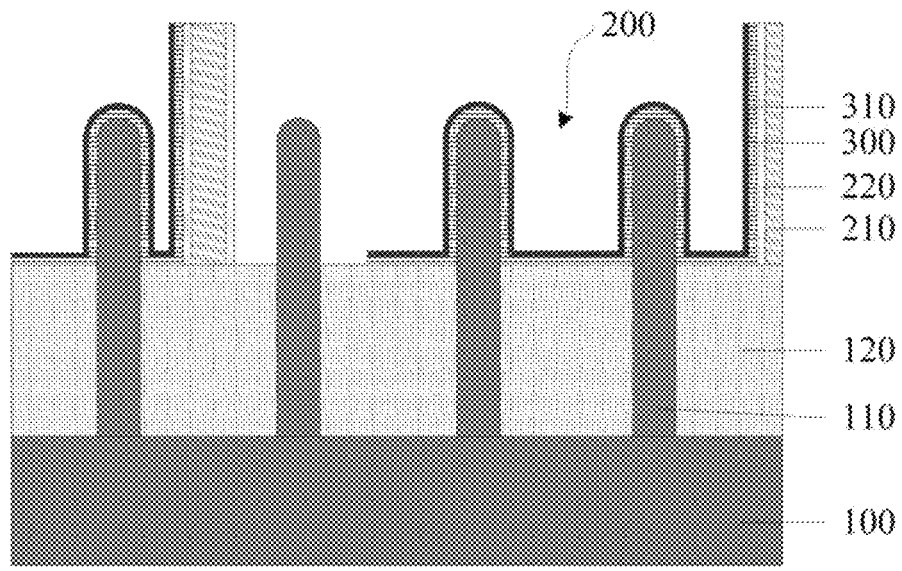
Figure 18:
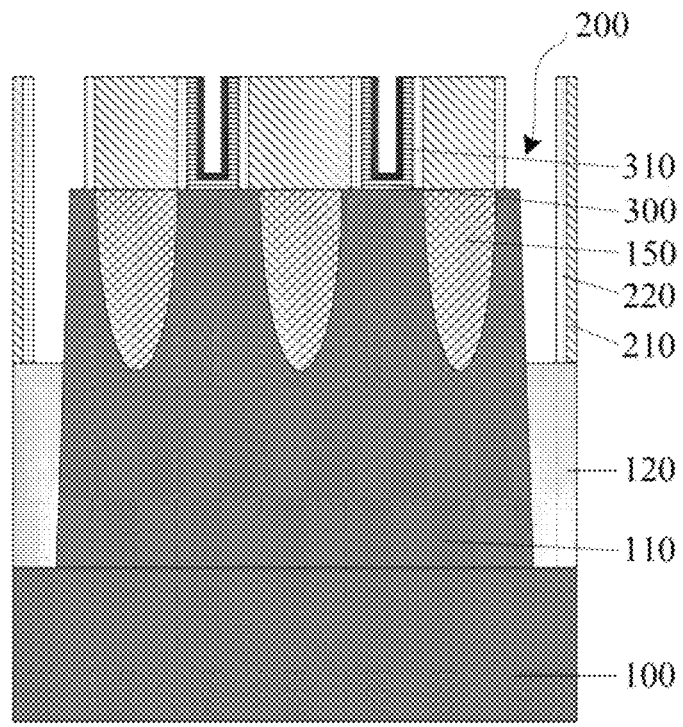

Referring to FIG. 16 to FIG. 18 together, FIG. 16 is a top view, FIG. 17 is a cross-sectional view in a direction of AA in FIG. 16, and FIG. 18 is a cross-sectional view in a direction of BB in FIG. 16. Along the opening 420 (shown in FIG. 15), the gate dielectric layer 300 on the surface of the fin 110 at the interconnect position 160 is removed.

The gate opening 200 located in either of the first region 100F and the second region 100S extends to the other region and exposes the fin 110 of the other region, and a position of the exposed fin 110 of the other region is used as the interconnect position 160. Therefore, the gate dielectric layer 300 on the surface of the fin 110 at the interconnect position 160 is removed, to expose the surface of the fin 110 at the interconnect position 160, so that the gate structure is directly electronically connected to the fin 110 at the interconnect position 160 subsequently.

In some implementations, the forming method is used for forming a SRAM device, and the first region 100F and the second region 100S are respectively used for forming a first pull-up transistor and a second pull-up transistor. Therefore, no share contact is needed to electrically connect the gate structure in either of the first region 100F and the second region 100S and the source/drain doped region 150 in the fin 110 corresponding to the interconnect position 160 of the other region. The gate dielectric layer 300 on the surface of the fin 110 at the interconnect position 160 is removed, to expose the surface of the fin 110 at the interconnect position 160, so that the fin 110 at the interconnect position is directly electrically connected to the gate structure subsequently. Therefore, the source/drain doped region 150 of the first pull-up transistor is directly electrically connected to the gate structure of the second pull-up transistor, and the source/drain doped region 150 of the second pull-up transistor is directly electrically connected to the gate structure of the first pull-up transistor, to realize the normal operation of the SRAM device without a share contact, which enlarges the process window of the electrical connection process, and can save masks, thereby correspondingly reducing process costs.

It should be noted that, in the process of removing the gate dielectric layer 300 on the surface of the fin 110 at the interconnect position 160, the gate dielectric layer 300 on the top of the isolation layer 120 exposed by the opening 420 is also removed.

In some implementations, before the gate dielectric layer 300 on the surface of the fin 110 at the interconnect position 160 is removed, the forming method further includes: removing the cap layer 310 on the surface of the fin 110 at the interconnect position 160.

The cap layer 310 on the surface of the fin 110 at the interconnect position 160 is removed, to remove the gate dielectric layer 300 on the surface of the fin 110 at the interconnect position 160.

In the process of etching the gate dielectric layer 300 at the interconnect position 160, the cap layer 310 is used for protecting the gate dielectric layer 300.

In addition, the cap layer 310 exposes the surface of the fin 110 at the interconnect position 160, so that an effect of the direct electrical connection between the subsequently formed gate structure and the fin 110 at the interconnect position is improved.

It should be noted that in other implementations, the cap layer may alternatively be formed after the gate dielectric layer at the interconnect position is etched and removed. Correspondingly, the cap layer may alternatively cover the fin at the interconnect position. Because the cap layer is made of a conductive material, even if the cap layer covers the fin at the interconnect position, the direct electrical connection between the gate structure in either region and the fin at the interconnect position in the adjacent other region can still be realized.

In some implementations, the cap layer 310 on the surface of the fin 110 at the interconnect position 160 is removed using the dry etching process.

The dry etching process has a characteristic of anisotropic etching with a vertical etching rate much higher than a horizontal etching rate. Therefore, using the dry etching process is beneficial to improving the accuracy of pattern transfer, and reducing damage to the cap layer 310 on the surface of the fin 110 at remaining positions when the cap layer 310 on the surface of the fin 110 at the interconnect position 160 is removed. Meanwhile, the gate dielectric layer 300 on the surface of the fin 110 at the interconnect position 160 is also removed through dry etching. The cap layer 310 and the gate dielectric layer 300 may be sequentially etched through dry etching.

In some implementations, after the gate dielectric layer 300 on the surface of the fin 110 at the interconnect position 160 is removed, the forming method further includes: removing the planarization layer 400 (shown in FIG. 15).

The planarization layer 400 is removed to provide a process basis for a subsequent manufacturing process.

Figure 19:
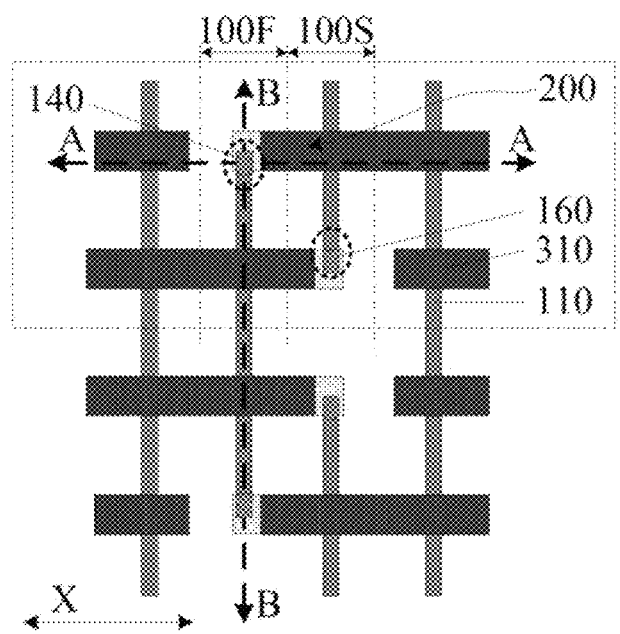
Figure 20:
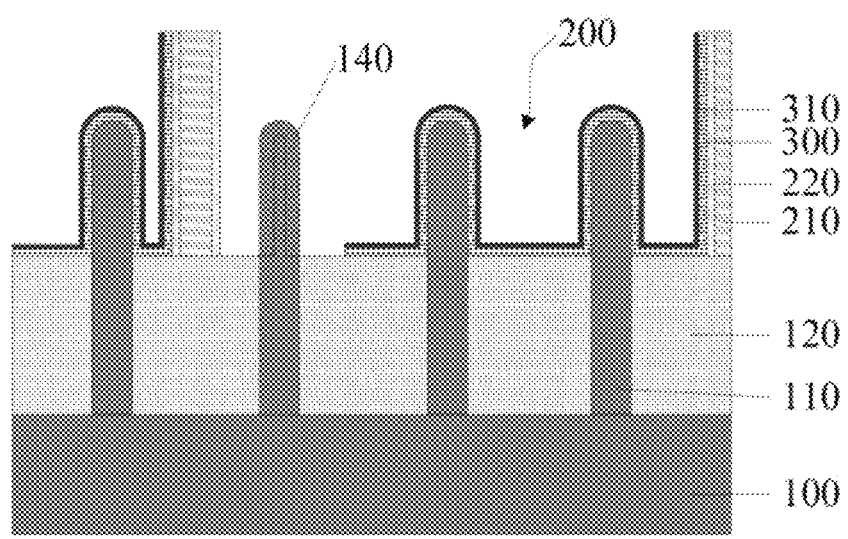
Figure 21:
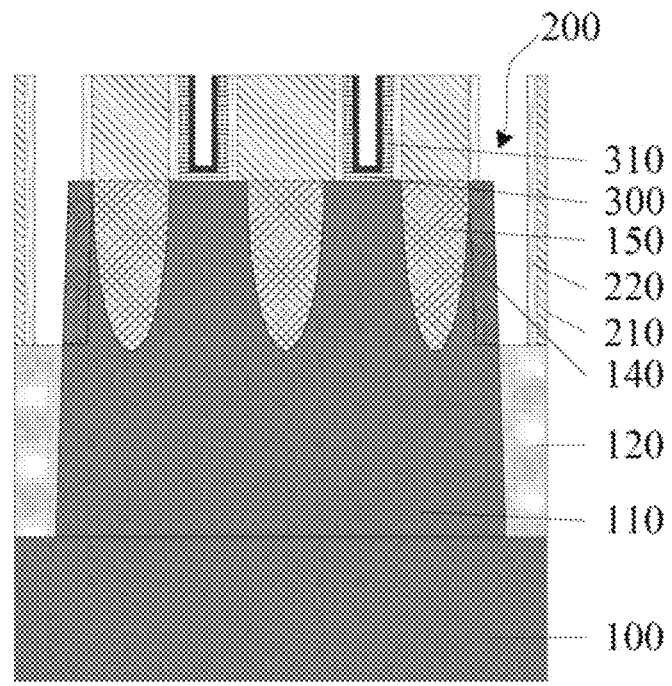

Referring to FIG. 19 to FIG. 21 together, FIG. 19 is a top view, FIG. 20 is a cross-sectional view in a direction of AA in FIG. 19, and FIG. 21 is a cross-sectional view in a direction of BB in FIG. 19. After the gate dielectric layer 300 on the surface of the fin 110 at the interconnect position 160 is removed, to expose the surface of the fin 110 at the interconnect position 160 (shown in FIG. 18), and before the gate structure is formed in the gate opening 200, the forming method further includes: performing metal silicide processing on the surface of the fin 110 exposed at the interconnect position 160, to form a metal silicide layer 140.

Because the metal silicide layer 140 has a relatively low resistivity, the metal silicide layer 140 is in direct contact with the gate structure, to reduce a contact resistance of the interconnect position 160.

In some implementations, the metal silicide layer 140 is formed using a self-overlay metal silicide process. It should be noted that because the self-overlay metal silicide process is forming the metal silicide layer 140 by consuming the material of the fin 110, according to different process requirements (such as a thickness requirement of the metal silicide layer 140) and a width of the fin 110, if a part of the width of the fin 110 at the interconnect position 160 is consumed, the metal silicide layer 140 covers the surface of the fin 110 at the interconnect position 160; if the fin 110 at the interconnect position 160 is completely consumed, the material of the fin 110 at the interconnect position 160 is a metal silicide material. Therefore, in this form, the metal silicide layer 140 covers the surface of the fin 110 at the interconnect position 160; or the material of the fin 110 at the interconnect position 160 is a metal silicide material.

In some implementations, a case in which the metal silicide layer 140 covers the surface of the fin 110 at the interconnect position 160 is shown.

In some implementations, the metal silicide layer 140 is in contact with the adjacent source/drain doped region 150 in the fin 110 corresponding to the interconnect position 160.

Subsequently, a source/drain contact located on a top of the source/drain doped region 150 and electrically connected to the source/drain doped region 150 is usually formed. After the gate structure is formed subsequently, because at the interconnect position 160, the gate structure and the fin 110 are directly electrically connected, the gate structure and the source/drain doped region 150 in the fin 110 corresponding to the interconnect position 160 are directly electrically connected. Correspondingly, the gate structure at the interconnect position 160 is electrically connected to the source/drain contact through the source/drain doped region 150 and the metal silicide layer 140. Therefore, the metal silicide layer 140 at the interconnect position 160 is in contact with the adjacent source/drain doped region 150 in the fin 110 corresponding to the interconnect position 160, thereby reducing a resistance between the gate structure at the interconnect position 160 and the source/drain contact, to improve the performance of the semiconductor structure.

A material of the metal silicide layer 140 includes a titanium silicon compound, a cobalt silicon compound, or a nickel silicon compound.

Figure 22:
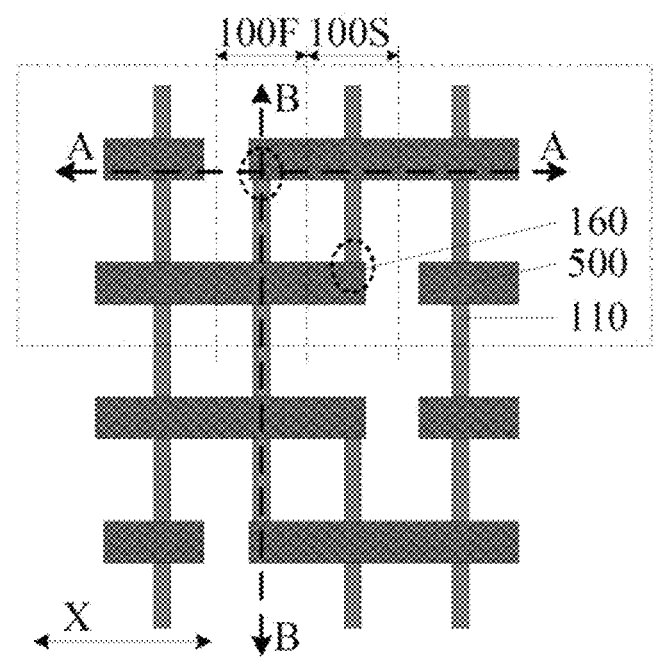
Figure 23:
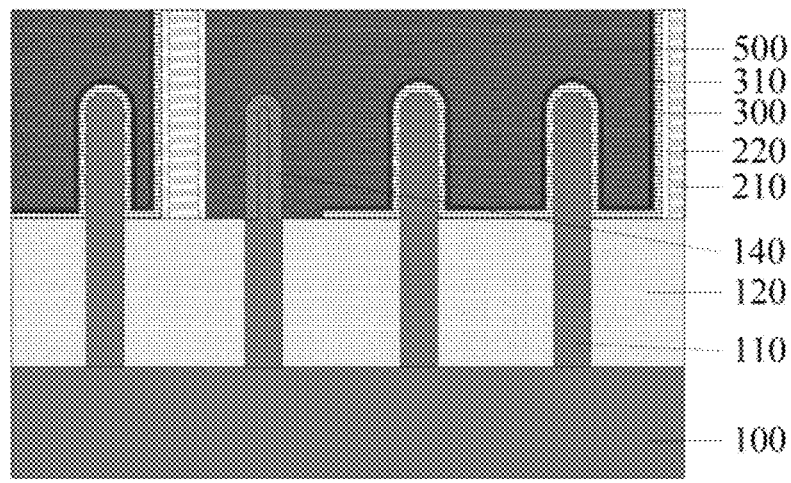
Figure 24:
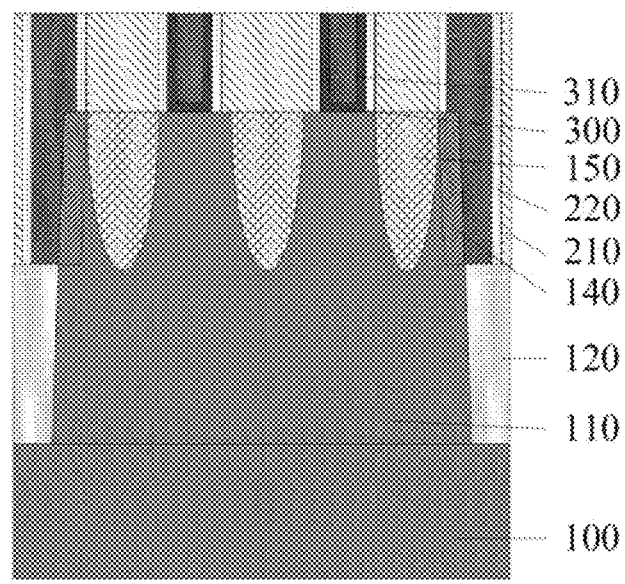

Referring to FIG. 22 to FIG. 24 together, FIG. 22 is a top view of fins and a gate structure, FIG. 23 is a cross-sectional view in a direction of AA in FIG. 22, and FIG. 24 is a cross-sectional view in a direction of BB in FIG. 22. A gate structure 500 is formed in the gate opening 200 (shown in FIG. 21).

In some implementations, the gate structure 500 includes a metal gate structure for controlling the channel of the FinFET to be turned on or off.

In some implementations, the metal gate structure includes a work function layer (not shown) and a gate electrode layer (not shown) located on the work function layer.

The work function layer is used for adjusting a threshold voltage of the FinFET. When a PMOS transistor is formed, the work function layer is a P-type work function layer, and a material of the P-type work function layer includes at least one of TiN, TaN, TaSiN, TaAlN, or TiAlN. When an NMOS transistor is formed, the work function layer is an N-type work function layer, and a material of the N-type work function layer includes at least one of TiAl, Mo, MoN, AlN, or TiAlC.

The gate electrode layer is used for electrically leading out the metal gate structure. In some implementations, a material of the gate electrode layer is Al, Cu, Ag, Au, Pt, Ni, Ti, or W.

Figure 25:
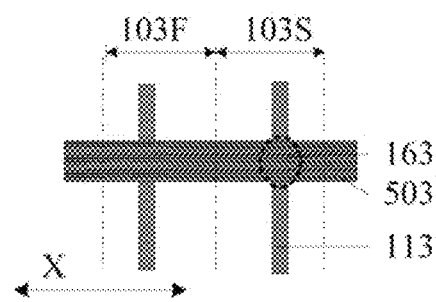
FIG. 25 is a schematic structural diagram corresponding to another form of a forming method of a semiconductor structure according to the present disclosure.

In other implementations, the gate structure may alternatively be a polysilicon gate structure according to process requirements. FIG. 25 is a schematic structural diagram corresponding to another form of a forming method of a semiconductor structure according to the present disclosure.

The similarities between this form and the foregoing forms are not repeated herein. The difference between this form of the present disclosure and the foregoing forms is that the substrate (not shown) includes, along an arrangement direction (shown by a direction X in FIG. 25) of a plurality of fins 113, a first region 103F and a second region 103S adjacent to each other, a gate opening (not marked) located in either of the first region 103F and second region 103S extends to the other region and exposes the fin 113 of the other region, and a position of the exposed fin 113 of the other region is used as an interconnect position 163. A transistor in the region of the fin 112 at the interconnect position 163 fails, and the fin in the other region is used for forming a transistor.

In some implementations, the gate opening in the first region 103F extends to the second region 103S and exposes the fin 113 in the second region 103S, and in the second region 103S, and a position of the fin 113 exposed by the gate opening in the first region 103F is used as the interconnect position 163.

The gate structure 503 in the first region 103F extends to the second region 103S and is directly electrically connected to the fin 113 at the interconnect position 163. Therefore, the first region 103F is used for forming a transistor, and the transistor in the second region 103S fails.

Specifically, the transistor in the second region 103S fails, and the fins 113 on two sides of the gate structure 503 in the second region 103S are also provided with a source/drain doped region. Therefore, the gate structure 503 in the first region 103F is electrically connected to the source/drain doped region (not shown) in the fin 113 corresponding to the interconnect position 163 in the second region 103S. Correspondingly, the gate structure 503 in the first region 103F can be electrically connected to an external circuit through the source/drain doped region in the second region 103S, to meet actual wiring requirements. That is, for the transistor in the first region 103F, a contact for electrically connecting to the gate structure 503 may be disposed in the source/drain doped region in the second region 103S, thereby enlarging the process window for electrical connection.

For detailed descriptions of the forming method of a semiconductor structure in this form, reference may be made to corresponding descriptions in the foregoing forms as details are not described herein again.

Although the present disclosure is described above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:
   a base, comprising a substrate and a plurality of fins protruding from the substrate, wherein the substrate comprises, along an arrangement direction of the plurality of fins, a first region and a second region adjacent to each other, where the first region and the second region are configured for use in for forming transistors;
   a gate structure, spanning the plurality of fins and covering a part of a top and a part of a sidewall of the fins of the plurality of fins, wherein the gate structure located in the first region extends to the second region and covers a middle portion of the fin of the second region, where a position of the covered fin of the second region is used as an interconnect position, and the gate structure and the fin are directly electrically connected at the interconnect position;
   a source doped region and a drain doped region, located in the fins of the plurality of fins on two sides of the gate structure, where the interconnect position is located between the source doped region and the drain doped region in the fin of the second region and the gate structure is electrically connected to the source doped region and the drain doped region in the fin corresponding to the interconnect position;
   a gate dielectric layer, located between the gate structure and the base, the gate dielectric layer exposing a surface of the fin at the interconnect position; and
   an interlayer dielectric layer, located on the substrate on a side of the gate structure and covering a sidewall of the gate structure.

2. The semiconductor structure according to claim 1, further comprising:
   a cap layer, located between the gate structure and the gate dielectric layer, and exposing the surface of the fin at the interconnect position.

3. The semiconductor structure according to claim 1, wherein:
   the semiconductor structure further comprises a metal silicide layer covering the surface of the fin at the interconnect position; or
   a material of the fin at the interconnect position comprises a metal silicide material that is used as a metal silicide layer.

4. The semiconductor structure according to claim 3, wherein the metal silicide layer is in contact with an adjacent source/drain doped region in the fin corresponding to the interconnect position.

5. The semiconductor structure according to claim 1, wherein:
   the semiconductor structure comprises a SRAM device, and the first region and the second region are configured respectively for use in forming a first pull-up transistor and a second pull-up transistor;
   the gate structure in the first region extends to the second region and covers the fins of the plurality of fins in the second region, and in the second region, a position of the fins of the plurality of fins covered by the gate structure in the first region is used as the interconnect position; and
   the gate structure in the second region extends to the first region and covers the fins of the plurality of fins in the first region, and in the first region, a position of the fins of the plurality of fins covered by the gate structure in the second region is used as the interconnect position.

6. The semiconductor structure according to claim 1, wherein the gate structure comprises a metal gate structure.

7. A forming method of a semiconductor structure, comprising:
   providing a base, comprising:
      a substrate and a plurality of fins protruding from the substrate,
      an interlayer dielectric layer formed on the substrate,
   a gate opening formed in the interlayer dielectric layer, the gate opening spanning the plurality of fins and exposing a part of a top and a part of a sidewall of the fins of the plurality of fins, and
   a source doped region and a drain doped region formed in the fins of the plurality of fins on two sides of the gate opening,
   wherein the substrate comprises, along an arrangement direction of the plurality of fins, a first region and a second region adjacent to each other, where the first region and the second region are respectively used for forming transistors, the gate opening located in the first region extends to the second region and exposes a middle portion of the fin of the second region, and where a position of the exposed fin of the second region is used as an interconnect position, the interconnect position is located between the source doped region and the drain doped region;

forming a gate dielectric layer covering a bottom and a sidewall of the gate opening and the fin in the gate opening conformally;

removing the gate dielectric layer on a surface of the fin at the interconnect position, to expose the surface of the fin at the interconnect position; and forming a gate structure in the gate opening after the surface of the fin at the interconnect position is exposed.

8. The forming method of a semiconductor structure according to claim 7, wherein:

after forming a gate dielectric layer on a bottom and a sidewall of the gate opening, and before removing the gate dielectric layer on a surface of the fin at the interconnect position, the forming method further comprises:

forming a planarization layer in the gate opening;

patterning the planarization layer, and forming an opening in the planarization layer at the interconnect position; and removing, along the opening, the gate dielectric layer on the surface of the fin at the interconnect position; and after removing the gate dielectric layer on the surface of the fin at the interconnect position, the forming method further comprises: removing the planarization layer.

9. The forming method of a semiconductor structure according to claim 7, wherein:

after forming a gate dielectric layer on a bottom and a sidewall of the gate opening, and before removing the gate dielectric layer on a surface of the fin at the interconnect position, the forming method further comprises: forming a cap layer covering the gate dielectric layer conformally; and before removing a gate dielectric layer on a surface of the fin at the interconnect position, the forming method further comprises: removing the cap layer on the surface of the fin at the interconnect position.

10. The forming method of a semiconductor structure according to claim 9, wherein the cap layer on the surface of the fin at the interconnect position is removed by using a dry etching process.

11. The forming method of a semiconductor structure according to claim 7, wherein after removing the gate dielectric layer on a surface of the fin at the interconnect position, to expose the surface of the fin at the interconnect position, and before forming a gate structure in the gate opening, the forming method further comprises: performing metal silicide processing on the surface of the fin exposed at the interconnect position, to form a metal silicide layer.

12. The forming method of a semiconductor structure according to claim 11, wherein in the step of forming the metal silicide layer, the metal silicide layer is in contact with the adjacent source/drain doped region in the fin corresponding to the interconnect position.

13. The forming method of a semiconductor structure according to claim 7, wherein before the forming an interlayer dielectric layer, the forming method further comprises:

forming a dummy gate layer on the base, the dummy gate layer spanning the fin and covering a part of a top and a part of a sidewall of the fin; and forming the interlayer dielectric layer on the base on a side of the dummy gate layer, the interlayer dielectric layer exposing a top of the dummy gate layer; and the step of forming the gate opening comprises: removing the dummy gate layer.

14. The forming method of a semiconductor structure according to claim 7, wherein the gate dielectric layer on the surface of the fin at the interconnect position is removed using a dry etching process, to expose the surface of the fin at the interconnect position.

15. The forming method of a semiconductor structure according to claim 7, wherein:

the semiconductor structure is a SRAM device, and the first region and the second region are respectively used for forming a first pull-up transistor and a second pull-up transistor;

the gate opening in the first region extends to the second region and exposes the fin in the second region, and in the second region, a position of the fin exposed by the gate opening in the first region is used as the interconnect position; and the gate opening in the second region extends to the first region and exposes the fin in the first region, and in the first region, a position of the fin exposed by the gate opening in the second region is used as the interconnect position.

16. The forming method of a semiconductor structure according to claim 7, wherein the gate structure comprises a metal gate structure.

* * * * *